United States Patent
Park et al.

(10) Patent No.: US 8,030,188 B2
(45) Date of Patent: Oct. 4, 2011

(54) METHODS OF FORMING A COMPOUND SEMICONDUCTOR DEVICE INCLUDING A DIFFUSION REGION

(75) Inventors: Mi-Ran Park, Daejeon (KR); Jae-Sik Sim, Daejeon (KR); Yong-Hwan Kwon, Daejeon (KR); Bongki Mheen, Daejeon (KR); Dae Kon Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 90 days.

(21) Appl. No.: 12/508,382

(22) Filed: Jul. 23, 2009

(65) Prior Publication Data

US 2010/0144123 A1 Jun. 10, 2010

(30) Foreign Application Priority Data

Dec. 5, 2008 (KR) .................. 10-2008-0123174
Mar. 31, 2009 (KR) .................. 10-2009-0027619

(51) Int. Cl.
*H01L 21/20* (2006.01)
*H01L 21/36* (2006.01)

(52) U.S. Cl. ............. 438/483; 438/567; 257/E21.085; 257/E21.135

(58) Field of Classification Search .......... 438/508, 438/567, 551, 542, 528, 483; 257/E21.085, 257/E21.11, E21.135, E21.14, E21.144, E21.141, 257/E21.146, E21.466

See application file for complete search history.

(56) References Cited

U.S. PATENT DOCUMENTS

| 5,700,714 | A | 12/1997 | Ogihara et al. |
| 5,982,024 | A * | 11/1999 | Hata et al. ............... 257/655 |
| 6,274,293 | B1 * | 8/2001 | Gupta et al. ............. 430/315 |
| 7,282,428 | B2 * | 10/2007 | Inada ...................... 438/559 |
| 7,622,372 | B1 * | 11/2009 | Chu et al. ................ 438/511 |
| 2002/0081764 | A1 * | 6/2002 | Springthorpe et al. ... 438/45 |
| 2003/0209192 | A1 * | 11/2003 | Hasegawa et al. ....... 117/84 |
| 2005/0094692 | A1 * | 5/2005 | Kim ......................... 372/43 |
| 2007/0243657 | A1 * | 10/2007 | Basol et al. .............. 438/95 |
| 2008/0175993 | A1 * | 7/2008 | Ashjaee et al. .......... 427/255.26 |

FOREIGN PATENT DOCUMENTS

| JP | 54-103670 | * 8/1979 |
| JP | 2000-228541 | 8/2000 |
| KR | 10-1999-0006160 | 1/1999 |
| KR | 10-0660240 | 12/2006 |

OTHER PUBLICATIONS

Abstract in English for JP 54-103670, Kobayashi et al (1979) 2 pages.*
Hyesook Hong et al., "Cryogenic Processed Metal-Semiconductor-Metal (MSM) Photodetectors on MBE Grown ZnSe" IEEE Transactions on Electron Devices, vol. 46, No. 6, Jun. 1999, pp. 1127-1134.

* cited by examiner

*Primary Examiner* — Caridad Everhart
(74) *Attorney, Agent, or Firm* — Rabin & Berdo, P.C.

(57) ABSTRACT

Provided is a method of forming a compound semiconductor device. In the method, a dopant element layer is formed on an undoped compound semiconductor layer. An annealing process is performed to diffuse dopants in the dopant element layer into the undoped compound semiconductor layer, thereby forming a dopant diffusion region. A rapid cooling process is performed using liquid nitrogen with respect to the substrate having the dopant diffusion region.

18 Claims, 5 Drawing Sheets

METHODS OF FORMING A COMPOUND SEMICONDUCTOR DEVICE INCLUDING A DIFFUSION REGION

CROSS-REFERENCE TO RELATED APPLICATIONS

This U.S. non-provisional patent application claims priorities under 35 U.S.C. §119 of Korean Patent Application Nos. 10-2008-0123174, filed on Dec. 5, 2008 and 10-2009-0027619, filed on Mar. 31, 2009, the entire contents of which are hereby incorporated by reference.

BACKGROUND OF THE INVENTION

The present invention disclosed herein relates to methods of forming a semiconductor device, and more particularly, to methods of forming a compound semiconductor device including a diffusion region.

Due to their miniaturization, lightweight, and other characteristics, semiconductor devices may be used as important elements in electronic industries. Generally, silicon-based semiconductor devices may be used as memory devices and/or logic devices. Modern electronic industries may require semiconductor devices with more specialized functions. For example, modern electronic industries may require light emitting diodes that generate light, semiconductor lasers used for laser oscillation, and/or RF oscillators used for RF oscillation. It may be somewhat difficult to realize silicon-based semiconductor devices with such special functions. For this reason, much research on compound semiconductors that can realize various characteristics is being performed. Compound semiconductors can easily realize various special functions that are difficult to realize with silicon-based semiconductors.

As stated above, compound semiconductor devices can realize special functions, which are difficult for silicon-based devices to realize. Also, compound semiconductor devices can realize functions superior to those that silicon-based devices can realize. Accordingly, a large amount of research on ways to realize devices with various functions using compound semiconductor is being performed.

A compound semiconductor device may include a diffusion region with dopants. The diffusion region may be one of the important elements for realizing a diode and the like. Control of the diffusion region may have a close relationship with semiconductor device characteristics. For example, when a boundary of the diffusion region is unstable, the characteristics of a compound semiconductor device may be deteriorated. Also, when the depth, etc. of the diffusion region do not meet target requirements, the characteristics of a compound semiconductor device may be deteriorated.

SUMMARY OF THE INVENTION

In some embodiments, a method of forming a compound semiconductor device may include: forming a undoped compound semiconductor layer on a substrate; forming a dopant element layer on the undoped compound semiconductor layer; performing an annealing process to diffuse dopants in the dopant element layer into the undoped compound semiconductor layer, thereby forming a dopant diffusion region; and performing a rapid cooling process using liquid nitrogen to the substrate having the dopant diffusion region.

In some embodiments, the performing of the rapid cooling process using liquid nitrogen may include dipping the substrate having the dopant diffusion region in the liquid nitrogen.

In other embodiments, the annealing process may be a rapid thermal annealing process.

In still other embodiments, after the rapid cooling process, the method may further include: removing remaining the dopant element layer; forming a dielectric layer covering the dopant diffusion region; performing a second annealing process with respect to the substrate having the dielectric layer to activate dopants inactivated in the dopant diffusion region; and performing a second rapid cooling process using liquid nitrogen with respect to the substrate having the dielectric layer.

In even other embodiments, the performing of the second rapid cooling process may include dipping the substrate, which undergoes the second annealing process, in the liquid nitrogen used in the second rapid cooling process.

In yet other embodiments, the second annealing process may be a rapid thermal annealing process.

In further embodiments, the method may further include: before the performing of the annealing process, forming a capping layer covering the dopant element layer; and after the performing of the rapid cooling process, removing the capping layer.

In still further embodiments, the dopant element layer may be formed to partially contact the undoped compound semiconductor layer. In this case, the forming of the dopant element layer may include: forming a hard mask layer on the undoped compound semiconductor layer; patterning the hard mask layer to form an opening partially exposing the undoped compound semiconductor layer; and forming the dopant element layer contacting the undoped compound semiconductor layer exposed by the opening, on the substrate.

In even further embodiments, the method may further include before the forming of the dopant element layer, recessing the undoped compound semiconductor layer exposed by the opening.

In yet further embodiments, before the performing of the annealing process, the method may further include patterning the dopant element layer. The patterned dopant element layer may contact the undoped compound semiconductor layer exposed by the opening.

In other embodiments, the substrate may be formed of a compound semiconductor doped with first type dopants, the dopant element layer may include second type dopants, and one of the first dopant type and the second dopant type may be an n-type dopant and the other may be a p-type dopant.

In still other embodiments, before the forming of the undoped compound semiconductor layer, the method may further include forming an absorptive compound semiconductor layer on the substrate. The absorptive compound semiconductor layer may have a lower bandgap than the undoped compound semiconductor layer, and may be in an intrinsic state.

In even other embodiments, before the forming of the undoped compound semiconductor layer, the method further include: forming a grading compound semiconductor layer on the absorptive compound semiconductor layer; and forming a charge sheet layer on the grading compound semiconductor layer.

In yet other embodiments, the substrate and the undoped compound semiconductor layer may be formed of a compound semiconductor including a Group 3A element and a Group 5A element, and the substrate may be doped with n-type dopants and the dopant element layer may be doped with p-type dopants.

In further other embodiments, the undoped compound semiconductor layer may be formed of InP and the dopant element layer may include at least one of zinc (Zn) and cadmium (Cd).

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1A:
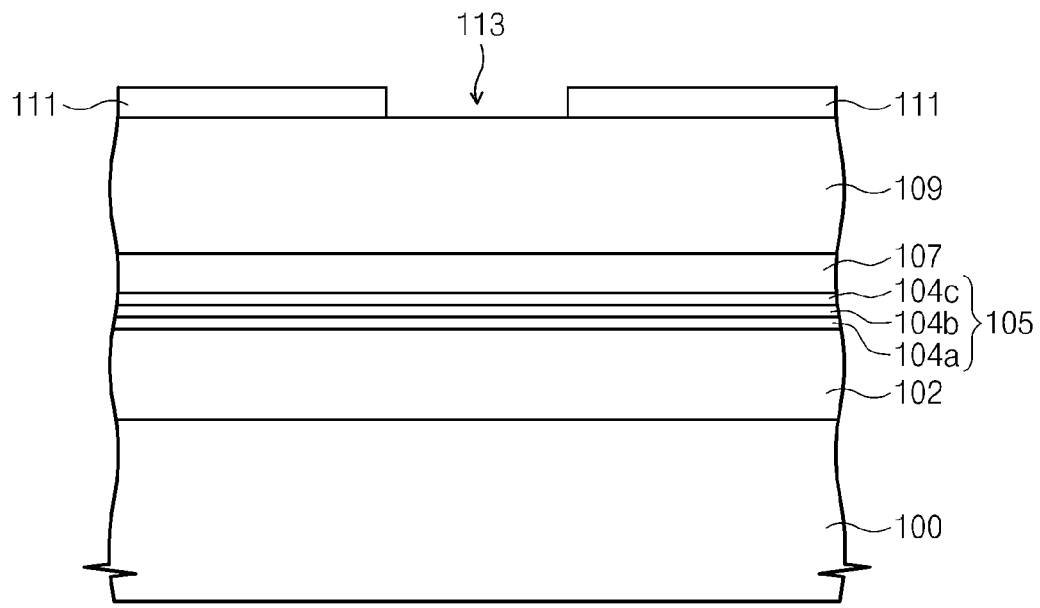
FIGS. 1A to 1E are cross-sectional views for describing a method of forming a compound semiconductor device according to an embodiment of the present invention.

Preferred embodiments of the present invention will now be described in more detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers (or films) and regions are exaggerated for clarity. It will also be understood that when a layer (or film) is referred to as being "on" another layer (or film) or substrate, it can be directly on the other layer (or film) or substrate, or intervening layers (or films) may also be present. As used herein, the term "and/or" includes any and all combinations of one or more of the associated listed items. Throughout the specification, like reference numerals in the drawings denote like elements.

Figure 1B:
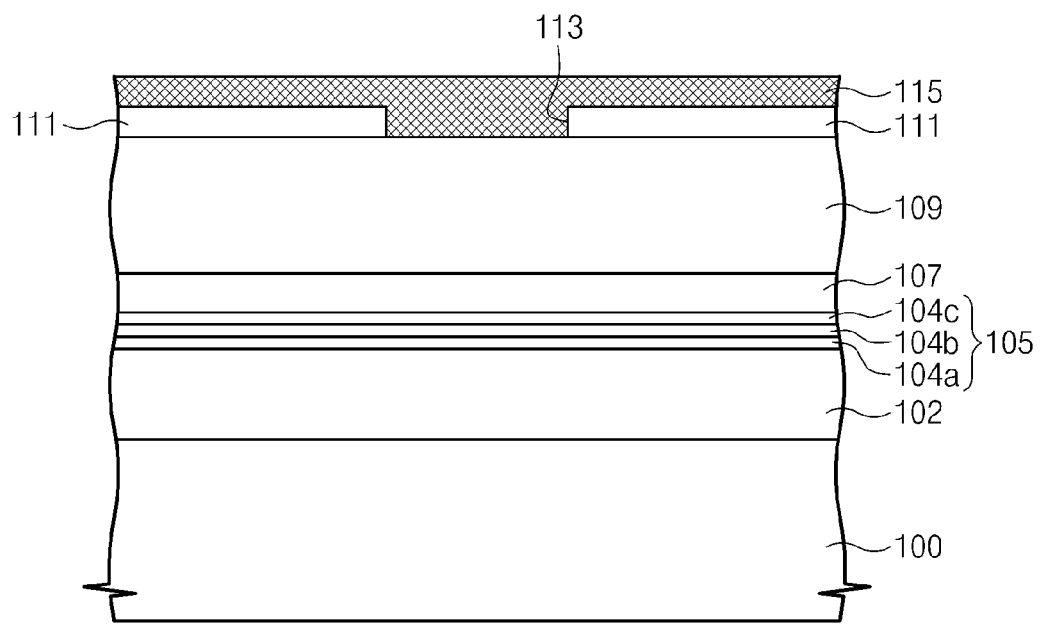
Figure 1C:
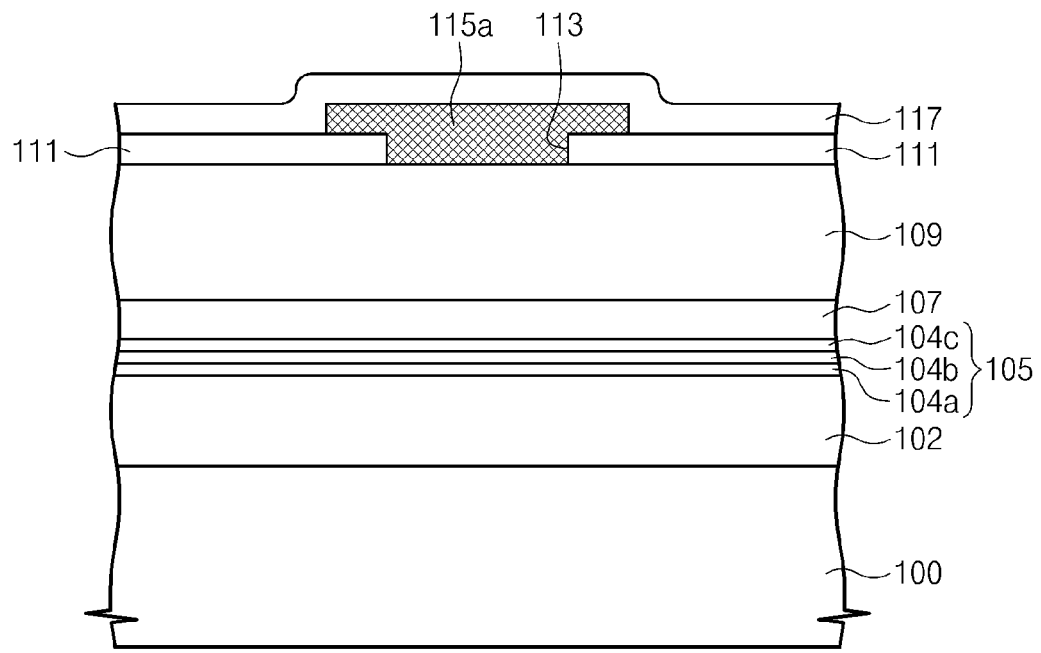
Figure 1D:
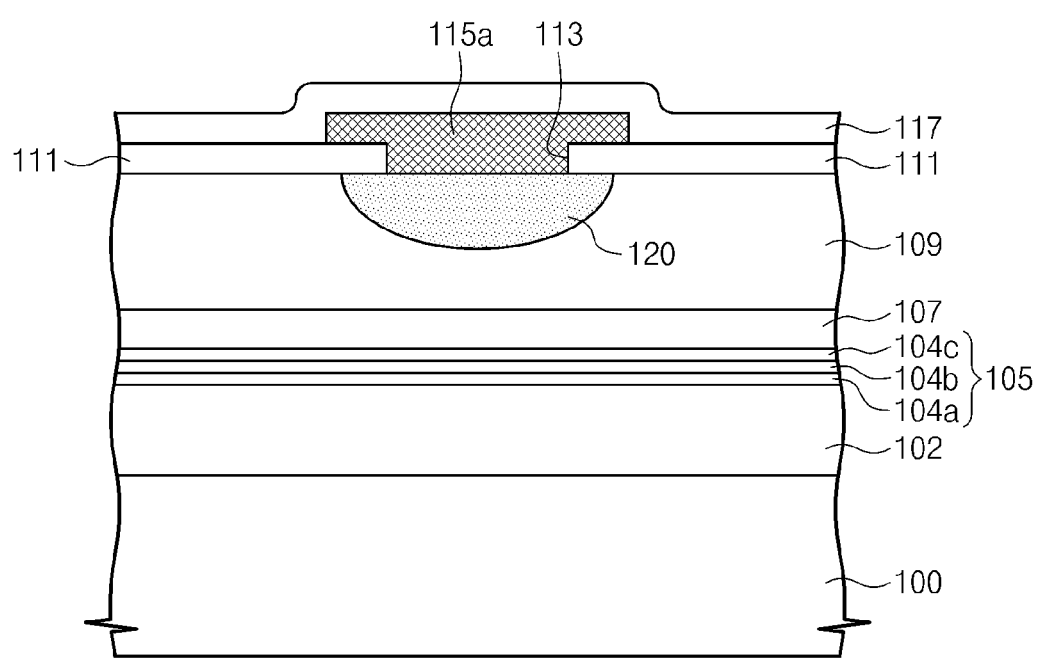
Figure 1E:
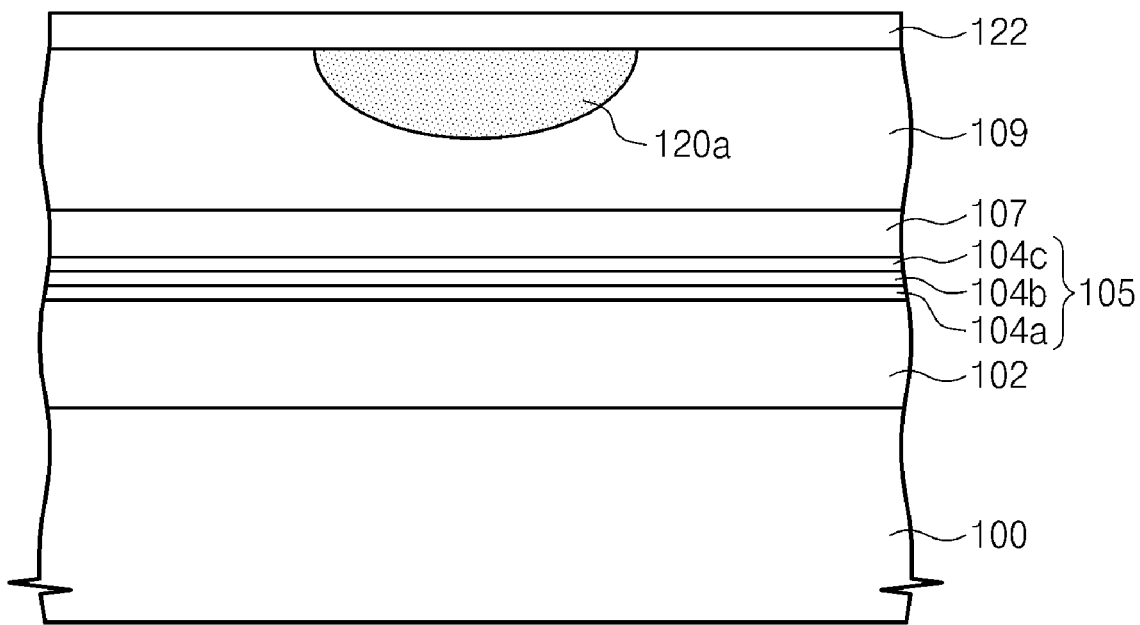
Figure 2:
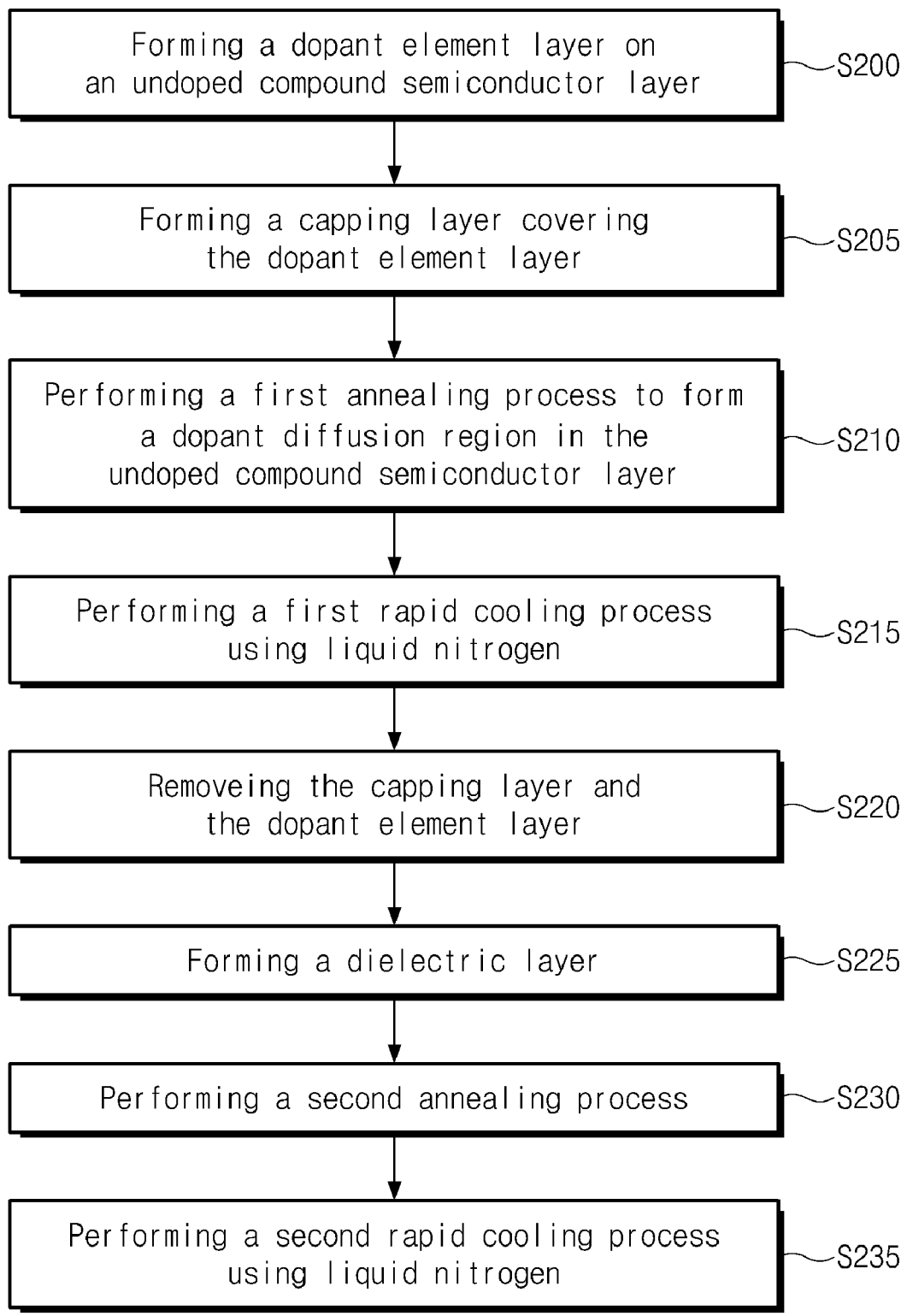
FIG. 2 is a flowchart for describing a method of forming a dopant diffusion region in a compound semiconductor device according to an embodiment of the present invention.

FIGS. 1A to 1E are cross-sectional views for describing a method of forming a compound semiconductor device according to an embodiment of the present invention, and FIG. 2 is a flowchart for describing a method of forming a dopant diffusion region in a compound semiconductor device according to an embodiment of the present invention.

Referring to FIG. 1A, an absorptive compound semiconductor layer 102 may be formed on a substrate 100. The substrate 100 may be formed of a compound semiconductor doped with a first type dopant. For example, the substrate 100 may be formed of a compound semiconductor including Group 3A (or Group 13) element and Group 5A (or Group 15) element. For example, the substrate 100 may be formed of InP. The absorptive compound semiconductor layer 102 may be formed of a compound semiconductor having a low bandgap compared with the substrate 100 and/or an undoped compound semiconductor layer 109 to be formed later. For example, the absorptive compound semiconductor layer 102 may be formed of InGaAs. The absorptive compound semiconductor layer 102 may be a layer, which absorbs light. The absorptive compound semiconductor layer 102 may be formed in an intrinsic state.

A grading compound semiconductor layer 105 may be formed on the absorptive compound semiconductor layer 102. The grading compound semiconductor layer 105 may be in an undoped state. A charge sheet layer 107 may be formed on the grading compound semiconductor layer 105. The charge sheet layer 107 may be formed of a compound semiconductor having a bandgap higher than the absorptive compound semiconductor layer 102. For example, the charge sheet layer 107 may be formed of InP. The charge sheet layer 107 may be doped with a dopant. For example, the charge sheet layer 107 may be doped with a dopant which is the same as that of the substrate 100. That is, the charge sheet layer 107 may be doped with the first type dopant.

The grading compound semiconductor layer 105 may be decrease the abrupt difference between the bandgap of the absorptive compound semiconductor layer 102 and the bandgap of the charge sheet layer 107. For example, the grading compound semiconductor layer 105 may be formed of a compound semiconductor having a bandgap, which is higher than that of the absorptive compound semiconductor layer 102 and is lower than that of the charge sheet layer 107. The bandgap of the grading compound semiconductor layer 105 may increase by degrees from a bottom surface of the grading compound semiconductor layer 105 to a top surface of the grading compound semiconductor layer 105. In this case, the grading compound semiconductor layer 105 may include a plurality of sub-grading layers 104a, 104b, 104c sequentially stacked. In this embodiment, it is shown that the grading compound semiconductor layer 105 includes, but is not limited to, first to third sub-grading layers 104a, 104b and 104c. The grading compound semiconductor layer 105 may include sub-grading layers of two layers or more. Each of the bandgaps of the sub-grading layers 104a, 104b and 104c may be uniform. At this time, a sub-grading layer, which is relatively high, may have a bandgap higher than another sub-grading layer, which is relatively low. For example, the sub-grading layers 104a, 104b and 104c may be formed of InGaAsP. The bandgaps required by the sub-grading layers 104a, 104b and 104c may be satisfied by changing the composition ratio of InGaAsP.

According to an embodiment of the present invention, the bandgap of the grading compound semiconductor layer 105 may increase gradually from the bottom surface to the top surface. In this case, the grading compound semiconductor layer 105 may be formed of InGaAsP and the composition ratio of InGaAsP may be changed gradually from the bottom surface to the top surface.

An undoped compound semiconductor layer 109 may be formed on the charge sheet layer 107. The undoped compound semiconductor layer 109 may be formed of a compound semiconductor including Group 3A (or Group 13) element and Group 5A (or Group 15). For example, the undoped compound semiconductor layer 109 may be formed of InP.

Next, a method of forming a dopant diffusion region in the undoped compound semiconductor layer 109 will be described with reference to the flowchart of FIG. 2 and FIGS. 1A through 1E.

Referring to FIGS. 1A, 1B and 2, a dopant element layer 115 is formed on the undoped compound semiconductor layer 109 (S200). The dopant element layer 115 may partially contact the undoped compound semiconductor layer 109. In detail, a hard mask layer 111 may be formed on the undoped compound semiconductor layer 109 and may be then patterned to form an opening 113 exposing a portion of the undoped compound semiconductor layer 109. The dopant element layer 115 may be formed on the substrate 100 having the opening 113. The dopant element layer 115 may contact the undoped compound semiconductor layer 109 exposed by the opening 113.

The dopant element layer 115 includes second type dopants. One of the first type dopant and the second type dopant is the n-type dopant and the other is the p-type dopant. For example, the first type dopant may be the n-type dopant and the second type dopant may be the p-type dopant. In this case, the substrate 100 and the charge sheet layer 107 may be formed of an n-type InP, and the dopant element layer 115 may include p-type dopants. On the contrary, the first type dopant may be the p-type dopant and the second type dopant may be the n-type dopant.

In the case where the substrate 100 and the undoped compound semiconductor layer 109 are formed of a compound semiconductor including Group 3A element and Group 5A element, the n-type dopants may be at least one selected from the group consisting of silicon (Si), selenium (Se), tellurium (Te), etc., and the p-type dopants may be at least one selected from the group consisting of zinc (Zn), cadmium (Cd), etc. In the case where the first type dopant is the n-type dopant and the second type dopant is the p-type dopant, the dopant element layer 115 may include at least one selected from the group consisting of zinc (Zn), cadmium (Cd), etc.

Referring to FIGS. 1C and 2, a capping layer 117 covering the dopant element layer 115 may be formed (S205). The capping layer 117 may cover an entire surface of the dopant element layer 115. Unlike this, according to some embodiments, the dopant element layer 115 may be patterned before the capping layer 117 is formed. The patterned dopant element layer 115a contacts the undoped compound semiconductor layer 109 exposed by the opening 113. The patterned dopant element layer 115a may cover a portion of a top surface of the hard mask layer 111 adjacent to the opening 113. In this case, the capping layer 117 may cover the patterned dopant element layer 115a. The capping layer 117 may be formed of silicon oxide, silicon nitride and/or silicon oxynitride.

Referring to FIGS. 1D and 2, a first annealing process is performed to the substrate 100 to form a dopant diffusion region 120 in the undoped compound semiconductor layer 109 (S210). By the first annealing process, the second type dopants in the dopant element layer 115 are diffused into the undoped compound semiconductor layer 109, so that the dopant diffusion region 120 is formed in the undoped compound semiconductor layer 109. The first annealing process may be preferably a rapid thermal annealing process. The first annealing process may have a process temperature ranging from about 500° C. to about 550° C. The first annealing process may have a process time ranging from about 10 minutes to about 15 minutes. After the first annealing process, at least some of the dopants in the dopant diffusion region 120 may be activated.

Next, a first rapid cooling process using liquid nitrogen is performed to the substrate 100 having the dopant diffusion region 120 (S215). The liquid nitrogen has a very low temperature. For example, the liquid nitrogen may have a very low temperature ranging from about −150° C. to about −200° C. depending on the pressure applied thereto. By the first rapid cooling process, the substrate 100 having the dopant diffusion region 120 is rapidly cooled. Since the dopant diffusion region 120 is rapidly cooled, a boundary surface of the dopant diffusion region 120 can be very precisely controlled. For example, a non-intended additional diffusion of the dopant diffusion region 120 can be minimized, such that an increase in the depth of the dopant diffusion region 120 can be minimized. Also, the boundary surface of the dopant diffusion region 120 can maintain a very stable state. The first rapid cooling process may be performed by dipping the substrate 100 having the dopant diffusion region 120 in the liquid nitrogen. In this case, it is preferable that a time interval between the first annealing process and the first rapid cooling process may be maintained very shortly, for example, for about 1 second to about 1 minute. However, the present invention is not limited thereto. The first rapid cooling process using the liquid nitrogen may be performed by methods different from the dipping method.

Referring to FIGS. 1E and 2, after the rapid cooling process is performed, the capping layer 117 and the dopant element layer 115a may be removed (S220). In the case where the capping layer 117 is formed of silicon oxide, the capping layer 117 may be removed by using buffer oxide etchant (BOE) solution. The removed dopant element layer 115a may correspond to a portion of the dopant element layer 115a remaining after supplying dopants into the undoped compound semiconductor layer 109 for the dopant diffusion region 120. In the case where the dopant element layer 115a is formed of zinc (Zn), the dopant element layer 115a may be removed by using an etch solution including nitric acid and deionized water.

After the capping layer 117 and the dopant element layer 115a are removed, the hard mask layer 111 may be removed to expose the undoped compound semiconductor layer 109 including the dopant diffusion region 120. The hard mask layer 111 may be removed by a wet etch and/or a dry etch.

Next, a dielectric layer 122 may be formed on the substrate 100 having the dopant diffusion region 120 (S225). The dielectric layer 122 covers the undoped compound semiconductor layer 109 including the dopant diffusion region 120. The dielectric layer 122 may contact the dopant diffusion region 120 and the undoped compound semiconductor layer 109. The dielectric layer 122 may be formed of silicon oxide, silicon nitride and/or silicon oxynitride.

Next, a second annealing process may be performed with respect to the substrate 100 having the dielectric layer 122 (S230). By the second annealing process, inactive dopants in the dopant diffusion region 120 may be activated. For example, after the first annealing process, at least some of the dopants in the dopant diffusion region 120 may be in an inactive state. In this case, the dopants in the inactive state may be activated by the second annealing process. A reference number "120a" represents the dopant diffusion region after the second annealing process is performed. The second annealing process is preferably a rapid thermal annealing process. The second annealing process may have a process temperature ranging from about 500° C. to about 550° C. The second annealing process may have a process time ranging from about 10 minutes to about 15 minutes. However, the present invention is not limited to the above-mentioned time range and/or temperature range.

Next, a second rapid cooling process using liquid nitrogen may be performed to the substrate 100 having the dopant diffusion region 120a (S235). By the second rapid cooling process, the dopant diffusion region 120a is rapidly cooled. Accordingly, a boundary surface of the dopant diffusion region 120a can be very precisely controlled. For example, a non-intended additional diffusion of the dopant diffusion region 120a can be minimized. Also, the boundary surface of the dopant diffusion region 120a can maintain a very stable state. The second rapid cooling process may be performed in such a manner as to dip the substrate 100 having the dopant diffusion region 120a in the liquid nitrogen. In this case, it is preferable that a time interval between the second annealing process and the second rapid cooling process should be maintained very shortly, for example, for about 1 second to about 1 minute. However, the present invention is not limited thereto. The second rapid cooling process may be performed by methods different from the dipping method.

According to an embodiment of the present invention, some of the dopants in the dopant diffusion region 120 may be activated by the first annealing process and others may be activated by the second annealing process. Unlike this, most of the dopants in the dopant diffusion region 120 may be activated by the second annealing process. Unlike these, according to an embodiment of the present invention, most of the dopants may be activated by the first annealing process. In this case, the second annealing process and the second rapid cooling process may be omitted.

The substrate 100, the absorptive compound semiconductor layer 102, the grading compound semiconductor layer 105, the charge sheet layer 107, the undoped compound semiconductor layer 109 and the dopant diffusion region 120a may constitute an avalanche photodiode.

According to the aforementioned methods of forming a compound semiconductor device, after the first annealing process is performed, the first rapid cooling process is performed (S215). Accordingly, the dopant diffusion region 120 can be formed very precisely. Also, the reproducibility of the dopant diffusion region 120 can be improved by minimizing an additional diffusion of the dopant diffusion region 120. As a result, it is possible to realize the dopant diffusion region 120 with superior reliability and reproducibility. Also, characteristic deterioration of the avalanche photodiode having the dopant diffusion region 120 can be minimized.

Additionally, after the second annealing process, the second rapid cooling process may be performed (S235). Accordingly, the dopant diffusion region 120a having the activated dopants can have superior reliability and enhanced reproducibility.

Next, a modified example of a method of forming a compound semiconductor device according to an embodiment of the present invention will be described with reference to the accompanying drawings. A method of the modified example is similar to the methods described with reference to FIGS. 1A to 1E. Accordingly, the same reference numbers will be used throughout the drawings to refer to the same or like parts, and the repetitive description on the same or like parts will be omitted.

Figure 3A:
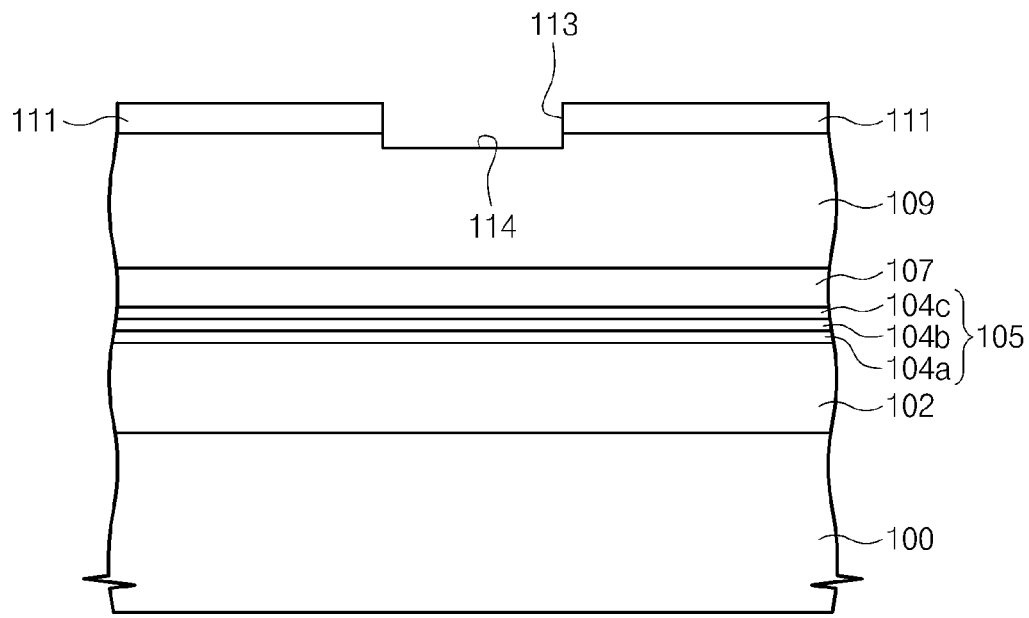
FIGS. 3A and 3B are cross-sectional views for describing a method of forming a compound semiconductor device according to a modified example of the embodiment of the present invention.
Figure 3B:
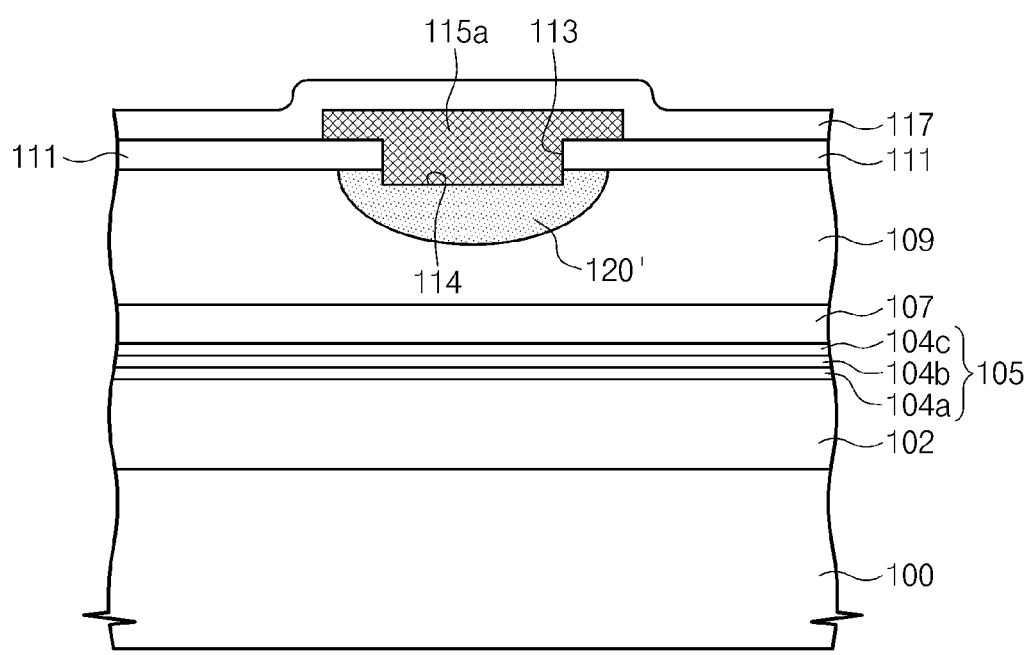

FIGS. 3A and 3B are cross-sectional views for describing a method of forming a compound semiconductor device according to a modified example of the embodiment of the present invention. This modified example may include the methods described with reference to FIG. 1A.

Referring to FIGS. 1A and 3A, the undoped compound semiconductor layer 109 exposed by the opening 113 may be recessed to form a recess region 114. The undoped compound semiconductor layer 109 exposed by the opening 113 may be recessed by an isotropic etch or anisotropic etch.

Referring to FIGS. 2 and 3B, a dopant element layer is formed (S200). The dopant element layer may contact an inner surface of the recess region 114. The dopant element layer may fill the opening 113 and the recess region 114. The dopant element layer may be patterned. The patterned dopant element layer 115a may fill the opening 113 and the recess region 114 and may also cover the top surface of the hard mask layer 113 partially.

Next, a capping layer 117 may be formed (S205). Thereafter, the first annealing process (S210) is performed to diffuse dopants in the dopant element layer 115a into the undoped compound semiconductor layer 109, thereby forming a dopant diffusion region 120'. By the recess region 114, the lowest bottom surface of the dopant diffusion region 120' may be lower than the bottom surface of the dopant diffusion region 120 shown in FIG. 1D. Next, a first rapid cooling process, which is described with reference to FIG. 2, is performed (S215). Thereafter, the operations (S220, S225, S230 and S235), which are described with reference to FIGS. 1E and 2, may be performed.

According to the embodiments of the present invention, a dopant diffusion region is rapidly cooled by a rapid cooling process using liquid nitrogen, it is possible to precisely control the dopant diffusion region. For example, it is possible to minimize a non-intended additional diffusion of the dopant diffusion region. Also, a boundary surface of the dopant diffusion region can have a very stable state. Accordingly, it is possible to realize the dopant diffusion region with superior reliability and/or enhanced reproducibility.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a compound semiconductor device, the method comprising:
    forming a grading compound semiconductor layer on a substrate;
    forming an undoped compound semiconductor layer on the grading compound semiconductor layer;
    forming a dopant element layer on the undoped compound semiconductor layer;
    performing an annealing process to diffuse dopants in the dopant element layer into the undoped compound semiconductor layer, thereby forming a dopant diffusion region; and
    performing a rapid cooling process using liquid nitrogen to the substrate having the dopant diffusion region.

2. The method of claim 1, wherein the performing of the rapid cooling process using liquid nitrogen comprises dipping the substrate having the dopant diffusion region in the liquid nitrogen.

3. The method of claim 1, wherein the annealing process is a rapid thermal annealing process.

4. The method of claim 1, further comprising:
    before the performing of the annealing process, forming a capping layer covering the dopant element layer; and
    after the performing of the rapid cooling process, removing the capping layer.

5. The method of claim 1, wherein the dopant element layer is formed to partially contact the undoped compound semiconductor layer.

6. The method of claim 5, wherein the forming of the dopant element layer comprises:
    forming a hard mask layer on the undoped compound semiconductor layer;
    patterning the hard mask layer to form an opening partially exposing the undoped compound semiconductor layer; and
    forming the dopant element layer contacting the undoped compound semiconductor layer exposed by the opening, on the substrate.

7. The method of claim 6, before the forming of the dopant element layer, further comprising:
recessing the undoped compound semiconductor layer exposed by the opening.

8. The method of claim 6, before the performing of the annealing process, further comprising:
patterning the dopant element layer,
wherein the patterned dopant element layer contacts the undoped compound semiconductor layer exposed by the opening.

9. The method of claim 1, wherein the substrate is formed of a compound semiconductor doped with first type dopants, the dopant element layer comprises second type dopants, and one of the first dopant type and the second dopant type is an n-type dopant and the other is a p-type dopant.

10. The method of claim 9, before the forming of the undoped compound semiconductor layer, further comprising:
forming an absorptive compound semiconductor layer on the substrate, wherein the absorptive compound semiconductor layer has a lower bandgap than the undoped compound semiconductor layer, and is in an intrinsic state.

11. The method of claim 10, wherein the grading compound semiconductor layer is formed on the absorptive compound semiconductor layer, and before the forming of the undoped compound semiconductor layer, the method further comprises
forming a charge sheet layer on the grading compound semiconductor layer.

12. The method of claim 9, wherein the substrate and the undoped compound semiconductor layer are formed of a compound semiconductor including a Group 3A element and a Group 5A element, and
the substrate is doped with n-type dopants and the dopant element layer is doped with p-type dopants.

13. The method of claim 12, wherein the undoped compound semiconductor layer is formed of InP and the dopant element layer comprises at least one of zinc (Zn) and cadmium (Cd).

14. A method of forming a compound semiconductor device, the method comprising:
forming an undoped compound semiconductor layer on a substrate;
forming a dopant element layer on the undoped compound semiconductor layer;
performing an annealing process to diffuse dopants in the dopant element layer into the undoped compound semiconductor layer, thereby forming a dopant diffusion region; and
performing a rapid cooling process using liquid nitrogen to the substrate having the dopant diffusion region,
after the rapid cooling process, further comprising:
removing remaining the dopant element layer;
forming a dielectric layer covering the dopant diffusion region;
performing a second annealing process to the substrate having the dielectric layer to activate dopants inactivated in the dopant diffusion region; and
performing a second rapid cooling process using liquid nitrogen to the substrate having the dielectric layer.

15. The method of claim 14, wherein the performing of the second rapid cooling process comprises dipping the substrate, which undergoes the second annealing process, in the liquid nitrogen used in the second rapid cooling process.

16. The method of claim 14, wherein the second annealing process is a rapid thermal annealing process.

17. A method of forming a compound semiconductor device, the method comprising:
forming an undoped compound semiconductor layer on a substrate;
recessing a portion of the undoped compound semiconductor layer; then forming a dopant element layer on the undoped compound semiconductor layer to cover an entire top surface of the recessed portion of the undoped compound semiconductor layer;
patterning the dopant element layer, wherein the patterned dopant element layer contacts the undoped compound semiconductor layer exposed by the opening; then
performing an annealing process to diffuse dopants in the dopant element layer into the undoped compound semiconductor layer, thereby forming a dopant diffusion region; and
performing a rapid cooling process using liquid nitrogen to the substrate having the dopant diffusion region.

18. A method of forming a compound semiconductor device, the method comprising:
forming an undoped compound semiconductor layer on a substrate;
forming a dopant element layer on the undoped compound semiconductor layer, wherein a hard mask layer is formed on the undoped compound semiconductor layer and the hard mask layer is patterned to form an opening partially exposing the undoped compound semiconductor layer;
patterning the dopant element layer, wherein the patterned dopant element layer contacts the undoped compound semiconductor layer exposed by the opening; then
performing an annealing process to diffuse dopants in the dopant element layer into the undoped compound semiconductor layer, thereby forming a dopant diffusion region; and
performing a rapid cooling process using liquid nitrogen to the substrate having the dopant diffusion region.

* * * * *